(12) United States Patent
Holzmann et al.

(10) Patent No.: US 7,939,937 B2
(45) Date of Patent: May 10, 2011

(54) CHIP HOUSING HAVING REDUCED INDUCED VIBRATION

(75) Inventors: Martin Holzmann, Gomaringen (DE); Frieder Haag, Wannweil (DE); Michael Knauss, Pfullingen (DE); Florian Grabmaier, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 155 days.

(21) Appl. No.: 12/226,999

(22) PCT Filed: Mar. 21, 2007

(86) PCT No.: PCT/EP2007/052701
§ 371 (c)(1),
(2), (4) Date: Feb. 12, 2009

(87) PCT Pub. No.: WO2007/131823
PCT Pub. Date: Nov. 22, 2007

(65) Prior Publication Data
US 2009/0194860 A1 Aug. 6, 2009

(30) Foreign Application Priority Data
May 16, 2006 (DE) .......................... 10 2006 022 807

(51) Int. Cl.
*H01L 23/12* (2006.01)

(52) U.S. Cl. ........................................ 257/711; 257/733
(58) Field of Classification Search .................. 257/711, 257/733
See application file for complete search history.

(56) References Cited

U.S. PATENT DOCUMENTS

| | | | |
|---|---|---|---|
| 7,468,552 B2 * | 12/2008 | Ohta | 257/686 |
| 2002/0003819 A1 * | 1/2002 | Kimura et al. | 372/36 |
| 2005/0035446 A1 * | 2/2005 | Karpman et al. | 257/711 |

FOREIGN PATENT DOCUMENTS

| | | |
|---|---|---|
| DE | 199 36 610 | 8/2000 |
| DE | 199 01 317 | 9/2000 |
| DE | 101 31 424 | 1/2003 |
| DE | 103 32 303 | 2/2005 |
| DE | 20 2005 0015 | 5/2005 |
| DE | 10 2005 0415 | 3/2006 |

* cited by examiner

*Primary Examiner* — Phat X Cao
(74) *Attorney, Agent, or Firm* — Kenyon & Kenyon LLP

(57) ABSTRACT

A premold housing for accommodating a chip structure includes a first part of the housing which is connected to the chip structure as well as connected in an elastically deflectable manner to an additional part of the housing which is fastened to the support structure bearing the entire housing. A mechanism is provided for damping the deflection of the first part of the housing which is connected to the chip structure.

13 Claims, 1 Drawing Sheet

CHIP HOUSING HAVING REDUCED INDUCED VIBRATION

BACKGROUND OF THE INVENTION

1. Field on the Invention

The present invention relates to a chip housing for accommodating a chip structure, e.g., a micromechanical sensor having reduced vibration induced in the chip structure.

2. Description of Related Art

As part of standardized fabrication, electronic components and micromechanical sensors are packaged in housings having prepared contact means which are normally fixedly connected to larger circuit structures, usually printed circuit boards or other supports. Due to the susceptibility of micromechanical sensors to stress, so-called premold housings have become established for their packaging, the basic structure of which is formed by casting before the connection between the actual chip structure having sensor functions and the housing accommodating this chip structure is produced. To this end, the chip structure is normally adhesively joined to a central area of the premold housing, for example by gluing one side of the chip structure to the bottom area of a prepared cavity. The housing is subsequently sealed.

In particular, micromechanical sensors used for various acceleration and motion sensors must themselves be protected against interference accelerations in order to avoid damage or malfunctions. Such interference accelerations can impact the component concerned through shock, or induced vibrations can impact the particular sensor via inadequately damped support structures. The danger of induced vibrations is in particular great when the sensors are used in the area of the vehicle electronic system. Therefore, it is attempted to keep the named influences low through design measures.

Such design measures include in particular the selection of an installation location, during the manufacture of the vehicle, which is exposed to only a limited degree of interference accelerations and a shockproof or vibration-damped installation of the assembly supporting a component sensitive to interference accelerations. The expense for a vibration-damped installation is presently relatively high due to the fact that entire printed circuit boards or built-in devices must usually be isolated from the rest of the vehicle with respect to vibration. The limitation to installation locations with low exposure to interference accelerations is in part associated with a similarly high expense, as it is frequently not possible or desirable to accommodate the complete assembly or the complete built-in device at the installation location coming into question for the placement of the micromechanical sensor, which may give rise to considerable expense for connecting the actual sensor and downstream analysis electronics. Both approaches are thus burdened by undesirable cost factors and limit the flexibility, in particular in the use of encapusulated micromechanical sensors.

BRIEF SUMMARY OF THE INVENTION

An object of the present invention is to provide an option for reducing the expense for the protection of sensor elements against interference accelerations and to open up additional installation locations for the use of micromechanical sensors, in particular for automotive applications.

The present invention implements the functions of conventional components for vibration isolation and shock absorption of entire assemblies or built-in devices with respect to the micromechanical sensor element at least partially in the housing of the sensor element. To that end, a premold housing is designed in such a way that the place at which the actual sensor element, i.e. the micromechanical chip structure, is to be fastened is included in the structure of a mechanical low pass and is connected, via this structure, to the rest of the premold housing which is connected to a printed circuit board or a comparable support structure.

The present invention provides a premold housing for accommodating a chip structure, a part of the housing which is connected to the chip structure being connected in an elastically deflectable manner to an additional part of the housing which is fastened to the support structure bearing the entire housing, means being provided for damping the deflection of the part of the housing which is connected to the chip structure.

The present invention thus prevents interference accelerations from the housing part, which may be fixedly joined to external assemblies, from being transferred to the housing part that supports the chip structure. Such premold housings may be used to particular advantage in micromechanical acceleration sensors or yaw rate sensors (inertial sensors).

Advantageously, the part of the housing which is connected to the chip structure includes a base plate which is connected to an additional part of the housing via at least one spring structure, which is at least partially in contact with a damping material, the additional part of the housing surrounding the base plate in the manner of a frame and being fastened to a support structure bearing the entire housing. The technological complexity is low in particular if the spring structure is made from the same material as the two housing parts. The spring structure and the two housing parts may be one molded part which may be manufactured in one operation and are normally made of plastic. Thermoplastic materials or epoxy in particular have proven themselves as housing materials.

Largely symmetrical housing designs are advantageous and very robust. They may be implemented, for example, if the part of the housing which is connected to the chip structure is connected via a bellows structure surrounding this part in an elastically deflectable manner to the part of the housing which is fastened to the support structure bearing the entire housing. Alternatively, the part of the housing which is connected to the chip structure may be connected via bar springs in an elastically deflectable manner to the part of the housing which is fastened to the support structure bearing the entire housing.

In addition to the low directional dependence of the protective action of such housing shapes, they automatically result in design possibilities for connecting the spring structure to means for damping the deflection of the part of the system bearing the chip. In particular, it has proven to be advantageous if the cavities surrounding either the folds of the bellows structure or the bar springs are at least partially filled with a vibration-damping material, the vibration-damping material advantageously containing silicone or being made exclusively from silicone. The focus is on the mechanical properties of the silicone. Silicone is an elastically deformable medium whose adhesiveness is suitable for adhering firmly to the spring structure and whose elastic and damping volume properties are suitable for making the deflectability according to the present invention possible with adequate damping. At the same time, its low modulus of elasticity ensures that the restoring forces produced by the silicone are only relatively weakly additively superimposed by the restoring forces produced by the spring structure. For the purposes of the present invention, silicone as a damping material may be replaced by similar media or media having equivalent effect.

A maximum damping action results if the available volumes are completely filled with the vibration-damping material. In this way, a firm connection is produced between the spring structure and the vibration-damping material along a large contact surface, which increases the effectiveness of the system and simultaneously protects the spring structure.

DETAILED DESCRIPTION OF THE INVENTION

Figure 1:
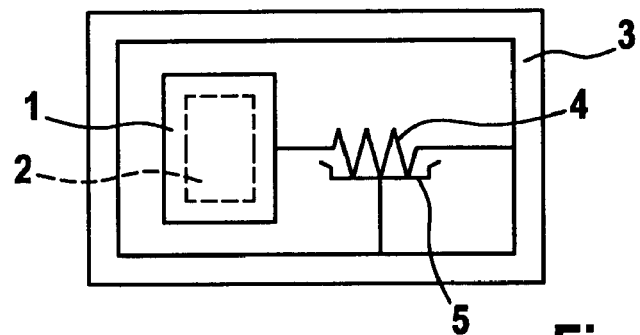
FIG. 1 shows a schematic representation of a premold housing according to the present invention.

FIG. 1 shows a schematic representation of a premold housing according to the present invention with whose aid the basic mode of operation is explained. A part 1 of the housing which is connected to chip structure 2 primarily includes a base area prepared for accommodating chip structure 2. A second part 3 of the housing, which may be fastened to a support structure bearing the entire housing, completely surrounds first part 1 of the housing in its main plane of extension. The connection between the two housing parts 1, 3 is produced by a spring structure 4 which ensures that first part 1 of the housing is elastically deflectable in relation to second part 3 of the housing. Means 5 for damping this deflection engage the spring structure and in particular prevent the occurrence of resonance effects or excessively long after-oscillation.

In a system of this type, a spring-mass-damper system, i.e. a mechanical low pass, is implemented, a largely functional separation being achieved between spring 4 and damper 5. The separation between the spring and the damper makes it possible to concentrate on as low as possible temperature dependence of the modulus of elasticity when selecting the material for the spring structure. At constant mass, the modulus of elasticity primarily determines the resonance frequency or the frequency at which the system after-oscillates without external excitation. Because the expected frequency range at which vibrations may be induced as a form of interference accelerations is known, in particular in automotive applications, the housing according to the present invention is designed in such a way that the resonance frequency is below this expected frequency range. The selection of a material having a largely non-temperature-dependent modulus of elasticity will also enable this design to cover a large temperature range without the danger of a strong inducement of vibrations at specific operating temperatures.

The damping properties of the material from which the spring structure is made may be disregarded in the present invention, since another material takes over the function of the damper. As a result, it is possible to use materials for the design of the spring structure that are normally used for the manufacture of chip housings, in particular thermoplastic materials or epoxy. These materials are normally distinguished by a high modulus of elasticity with low temperature dependence; however, they exhibit poor damping properties. An elastic plastic having good damping properties, preferably a silicone material, is used as a damper for the reasons stated above.

Figure 2:
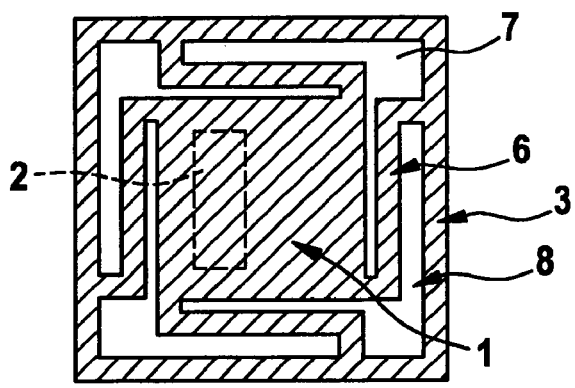
FIG. 2 shows a schematic representation of the central area of a premold housing according to the present invention having bar springs.

FIG. 2 shows a schematic representation of the central area of the premold housing according to the present invention having bar springs 6 as a connecting spring structure. A first part 1 of the housing which is connected to the chip structure is designed as a square area connected to second housing part 3 via four bar springs 6, each of which is connected to a corner of the square area.

The bottom of second housing part 3 has means (not shown) which make a solder connection to a printed circuit board possible, the attachment being implemented, for example, on a supporting structure bearing the entire housing within the context of the present invention.

Between the two housing parts 1, 3 is located an intermediate space 7 which makes adequate deflectability of the central square area possible. This intermediate space is bridged by bar springs 6 without being completely filled by bar springs 6. Cavity 8 surrounding the bar springs, which is limited by the two housing parts 1, 3, is filled with silicone which acts as a vibration-damping material.

The length of bar springs 6 corresponds roughly to the side length of the square area. Bar springs 6 have a main extension direction parallel to the edge of the square area and each is connected to the two housing parts 1, 3 via angled areas. This geometry makes a relatively large spring length possible with a low space requirement. Knowing the mass of the chip-populated area 1 and varying the spring length and/or the cross section of bar springs 6 makes it possible to set the resonance frequency of the system and accordingly the base frequency of the system operating as a mechanical low pass.

The great length of bar springs 6 in this case and the complete filling of the spring environment with silicone results in a fixed connection between the spring structure and the vibration-damping material along a large contact surface, which increases the effectiveness and damping and simultaneously serves to protect the spring structure. It is possible to implement the geometry shown by manufacturing a single molded part. The present spring structure made up of four bar springs 6 and the two housing parts 1, 3 form a molded part of PEEK (polyether ether ketone).

The part of housing 1 which is connected to the chip structure forms a vibration-decoupled base surface which is connected to the other part 3 of the housing via a spring-damper system. Above the base frequency of this system operating as a mechanical low pass, only a slight or non-relevant amount of vibrations is induced in the base surface, as a result of which this type of interference accelerations and brief shock vibrations are kept away from a chip structure fastened to this housing part 1 in connection with the deflectability resulting from the design.

Figure 3:
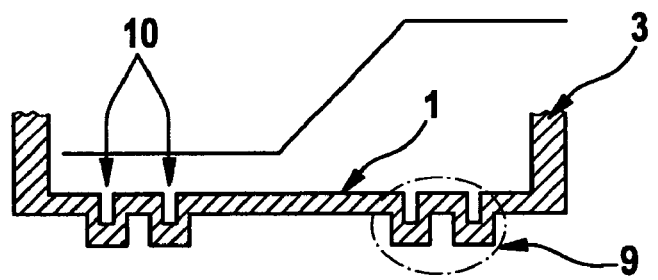
FIG. 3 shows a schematic representation of a premold housing according to the present invention having a bellows structure.

FIG. 3 is a schematic representation of a premold housing according to the present invention having a bellows structure. First part 1 of the housing which is connected to the chip structure is designed as a base area which is connected to second housing part 3 via a circumferential bellows structure 9. Bellows structure 9 produces the troughs surrounding the chip-bearing base area, it being possible for the desired spring properties to be adapted via the trough geometry. In the present embodiment, the troughs are designed as parallel-walled grooves 10. The troughs are filled with silicone which acts as a vibration-damping material. Knowing the mass of the chip-populated area 1 and varying the trough depth and/or the cross section of the material in the area of the bellows structure makes it possible to set the resonance frequency of the system and accordingly the base frequency of the system acting as a mechanical low pass.

Figure 4:
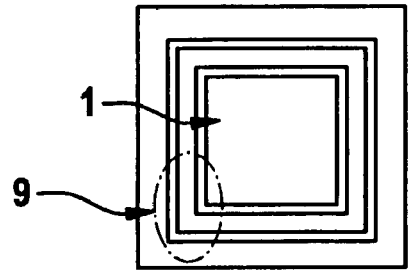
FIG. 4 shows a top view of a premold housing according to the present invention having a bellows structure.

FIG. 4 shows a top view of the premold housing according to the present invention having bellows structure 9 of FIG. 3. It is evident that the part of housing 1 which is connected to the chip structure is again a square area. The troughs which are characteristic of bellows structure 9 acting as a spring structure surround this square area.

The high degree of symmetry which characterizes the housing shapes of the preceding exemplary embodiments, in particular the geometry of the spring structures, ensures a low directional dependence of the protective action of the housing shapes according to the present invention. In automotive uses of the present invention in particular, this makes it possible to open up numerous installation locations because hardly any attention must be paid to a special orientation of the component.

The integration of a complete mechanical low pass according to the present invention into a premold housing may eliminate additional measures for isolating the sensor chip with respect to vibration. Since very low spring constants are necessary due to the low masses of customary chip structures in order to reliably shield against vibrations in the range of 1 kHz occurring in vehicles, the geometries of the spring structures of the exemplary embodiments which may be adapted with low technological complexity represent another advantage of the present invention.

Chips integrated in housings according to the present invention may be used in various installation locations in vehicles without problems without the spatial separation between the chip and downstream analysis electronics. This aids in reducing the connection expense for different applications, in particular for micromechanical sensors.

What is claimed is:

1. A premold housing for accommodating a chip structure, comprising:
   a first part of the housing connected to the chip structure;
   a second part of the housing, wherein the first part is connected to the second part of the housing by at least one spring structure in an elastically deflectable manner, and wherein the second part of the housing is fastened to a support structure bearing the entire housing; and
   a damping mechanism at least partially in contact with the at least one spring structure, wherein the damping mechanism is configured to damp a deflection of the first part of the housing connected to the chip structure, and wherein the damping mechanism is formed of a different material than the at least one spring structure.

2. The premold housing as recited in claim 1, wherein the first part of the housing connected to the chip structure includes a base plate connected to the second part of the housing by the least one spring structure, and wherein the second part of the housing surrounds the base plate and is fastened to the support structure bearing the entire housing.

3. The premold housing as recited in claim 2, wherein the at least one spring structure is made of the same material as the first and second parts of the housing.

4. The premold housing as recited in claim 2, wherein the at least one spring structure and the first and second parts of the housing are configured as a single integral plastic part.

5. The premold housing as recited in claim 4, wherein the at least one spring structure and the first and second parts of the housing are configured as a single integral molded part made of polyether-ether-ketone.

6. The premold housing as recited in claim 2, wherein the at least one spring structure is a bellows structure surrounding the first part of the housing.

7. The premold housing as recited in claim 2, wherein the at least one spring structure includes a bar spring.

8. The premold housing as recited in claim 6, wherein the damping mechanism includes a vibration-damping material at least partially filling troughs located between folds of the bellows structure.

9. The premold housing as recited in claim 8, wherein the vibration-damping material contains silicone.

10. The premold housing as recited in claim 2, wherein the chip structure includes one of a micromechanical acceleration sensor or a rotational speed sensor, and wherein the second part of the housing fastened to the support structure bearing the entire housing has a connection mechanism configured to enable a solder connection to a printed circuit board.

11. The premold housing as recited in claim 2, wherein the damping mechanism includes a vibration-damping material filling a cavity between the at least one spring structure and the second part of the housing.

12. The premold housing as recited in claim 2, wherein the damping mechanism has a low modulus of elasticity relative to the at least one spring structure.

13. The premold housing as recited in claim 12, wherein the at least one spring structure is formed of a material having a low temperature dependence.

* * * * *